(12) United States Patent
Lo

(10) Patent No.: US 11,158,736 B2
(45) Date of Patent: Oct. 26, 2021

(54) MOSFET STRUCTURE, AND MANUFACTURING METHOD THEREOF

(71) Applicant: CSMC TECHNOLOGIES FAB2 CO., LTD., Jiangsu (CN)

(72) Inventor: Tse-Huang Lo, Taiwan (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 16/890,151

(22) Filed: Jun. 2, 2020

(65) Prior Publication Data

US 2020/0295184 A1    Sep. 17, 2020

Related U.S. Application Data

(63) Continuation-in-part of application No. PCT/CN2018/117356, filed on Nov. 26, 2018.

(51) Int. Cl.
*H01L 29/78* (2006.01)
*H01L 29/423* (2006.01)
(Continued)

(52) U.S. Cl.
CPC ...... *H01L 29/7813* (2013.01); *H01L 29/4236* (2013.01); *H01L 29/4941* (2013.01); *H01L 29/66734* (2013.01); *H01L 29/7806* (2013.01)

(58) Field of Classification Search
CPC ............. H01L 29/7813; H01L 29/4238; H01L 29/7803; H01L 29/42376; H01L 29/66734; H01L 29/0865; H01L 29/1095
See application file for complete search history.

(56) References Cited

U.S. PATENT DOCUMENTS

2004/0256666 A1* 12/2004 Fujishima ......... H01L 29/66666
                                                                257/329
2008/0035987 A1    2/2008 Herbert
(Continued)

FOREIGN PATENT DOCUMENTS

CN        101771049 A      7/2010
CN        101853852 A     10/2010
(Continued)

OTHER PUBLICATIONS

International Search Report dated Mar. 4, 2019 in counterpart Patent Application PCT/CN2018/117356 (2 pages).
(Continued)

*Primary Examiner* — Mohammed R Alam
(74) *Attorney, Agent, or Firm* — Polsinelli PC

(57) ABSTRACT

A MOSFET structure and a manufacturing method thereof are provided. The structure includes a substrate, a well region of a first conductivity type, a first trench formed on a surface of the well region of the first conductivity type and extending downwards to a well region of a second conductivity type, a source disposed in the well region of the second conductivity type and under the first trench, a gate oxide layer disposed on an inner surface of the first trench, a polysilicon gate disposed on the gate oxide layer, a conductive plug extending downwards from above the first trench and being in contact with the well region of the second conductivity type after extending through the source, an insulation oxide layer filled in the first trench between the conductive plug and the polysilicon gate, and a drain disposed outside the first trench and obliquely above the source.

20 Claims, 12 Drawing Sheets

(51) Int. Cl.
*H01L 29/49* (2006.01)
*H01L 29/66* (2006.01)

(56) References Cited

U.S. PATENT DOCUMENTS

| | | | |
|---|---|---|---|
| 2008/0035988 | A1 | 2/2008 | Hshieh |
| 2012/0267713 | A1 | 10/2012 | Hsu et al. |
| 2013/0341705 | A1 | 12/2013 | Raghavan et al. |
| 2014/0197479 | A1* | 7/2014 | Um .................. H01L 29/66734 257/330 |

FOREIGN PATENT DOCUMENTS

| | | |
|---|---|---|
| CN | 102280487 A | 12/2011 |
| CN | 102945808 A | 2/2013 |
| CN | 103545370 A | 1/2014 |
| CN | 104518028 A | 4/2015 |
| CN | 105679810 A | 6/2016 |
| CN | 105932042 A | 9/2016 |
| CN | 106252396 A | 12/2016 |
| CN | 106876472 A | 6/2017 |
| CN | 106920848 A | 7/2017 |
| CN | 107425056 A | 12/2017 |
| JP | 2015-195286 A | 11/2015 |

OTHER PUBLICATIONS

Chinese Office Action dated Apr. 24, 2020 in counterpart Patent Application No. 201711269321.1 (8 pages).
Office Action dated Dec. 19, 2019 issued in corresponding Chinese Patent Application No. 201711270146.8 (5 pages).
Office Action dated May 21, 2020 issued in corresponding Chinese Patent Application No. 201711270129.4 (9 pages).

* cited by examiner

MOSFET STRUCTURE, AND MANUFACTURING METHOD THEREOF

CROSS-REFERENCE TO RELATED APPLICATIONS

The present application is a Continuation-in-Part of International Application No. PCT/CN2018/117356 filed on Nov. 26, 2018, which claims priority to Chinese Patent Application No. 201711270129.4, filed on Dec. 5, 2017. Both applications are incorporated herein by reference in their entireties.

TECHNICAL FIELD

The present disclosure relates to the field of semiconductor manufacture, particularly to a MOSFET (Metal Oxide Semiconductor Field Effect Transistor) structure and a manufacturing method thereof.

BACKGROUND

For a lateral high-voltage device made by a conventional integration process, such as a laterally diffused metal oxide semiconductor field effect transistor (LDMOSFET), the adjustment of the withstand voltage and the reduction of the on-resistance are achieved by changing the concentration and the length of a drift region at a drain terminal. For a lateral high-voltage device in which the length of the drift region accounts for most of the device size, further increasing the device voltage or reducing the device size cannot be achieved. Especially when the device is optimized to reach a physical limit state, it may not be realistic to further reduce the device size.

SUMMARY

According to various embodiments of the present disclosure, a metal oxide semiconductor field effect transistor (MOSFET) structure and a manufacturing method thereof are provided.

A MOSFET structure includes a substrate; a well region of a first conductivity type disposed on the substrate; at least one first trench formed on a surface of the well region of the first conductivity type and extending downwards; a well region of a second conductivity type, the first trench extending downwards to the well region of the second conductivity type; a gate oxide layer disposed on an inner surface of the first trench; a polysilicon gate disposed inside the gate oxide layer and filled in a portion of a bottom and a sidewall of the first trench; a source having the first conductivity type, and disposed in the well region of the second conductivity type and under the first trench inside the polysilicon gate; a conductive plug extending downwards from above the first trench, and being in contact with the well region of the second conductivity type after extending through the source; an insulating oxide layer filled in the first trench between the conductive plug and the polysilicon gate, the insulating oxide layer covering the polysilicon gate and insulating and isolating the polysilicon gate from the source; and a drain having the first conductivity type, the drain being disposed in the well region of the first conductivity type, outside the first trench and obliquely above the source. The first conductivity type and the second conductivity type are opposite conductivity types.

A method of manufacturing a MOSFET structure includes: step S110: providing a wafer having a well region of a first conductivity type formed on a substrate; step S120: forming a trench extending downwards on a surface of the well region of the first conductivity type, and the trench comprising a first trench; step S130: forming a gate oxide layer on an inner surface of the first trench; step S140: filling polysilicon into the first trench to full fill the first trench; step S150: etching the polysilicon to a predetermined thickness to form a polysilicon layer having the predetermined thickness at a bottom of the first trench; step S160: forming a first insulating oxide layer on a surface of the polysilicon layer and a sidewall of the first trench; step S170: etching the first insulating oxide layer and the polysilicon layer downwards to expose the bottom of the first trench, and reserving the polysilicon layer and the first insulating oxide layer located at the sidewall of the first trench; step S180: forming a well region of a second conductivity type under the first trench and forming a source of the first conductivity type in the well region of the second conductivity type; step S190: forming a second insulating oxide layer in the first trench to insulate and isolate the polysilicon layer from the source; and step S210: forming a drain obliquely above the source and filling a conductive material into the first trench to form a conductive plug. The first conductivity type and the second conductivity type are opposite conductivity types.

Details of one or more embodiments of the present disclosure are set forth in the accompanying drawings and description below. Other features, objects, and advantages of the disclosure will become apparent from the description, the drawings, and the claims.

DETAILED DESCRIPTION OF THE EMBODIMENTS

In order to facilitate understanding of the present disclosure, the present disclosure will be described more fully with reference to the accompanying drawings. The drawings show a preferred embodiment of the disclosure. However, the present disclosure can be implemented in many different forms and is not limited to the embodiments described herein. Rather, these embodiments are provided so that this disclosure will be thorough and complete.

Unless defined otherwise, all technical and scientific terms used herein have the same meaning as commonly understood by one of ordinary skill in the art to which this disclosure belongs. The terms used herein in the description of the disclosure are for the purpose of describing particular embodiments only and are not intended to limit the invention. The term "and/or" as used herein includes any and all combinations of one or more of the associated listed items.

The terms used in the field of semiconductor have the same meaning as commonly understood by persons of ordinary skill in the art. For example, regarding P-type and N-type impurities, in order to distinguish the doping concentration, the P+-type represents the P-type with heavy doping concentration, the P-type represents the P-type with medium doping concentration, the P--type represents the P-type with light doping concentration, the N+-type represents the N-type with heavy doping concentration, the N-type represents the N-type with medium doping concentration, and the N--type represents the N-type with light doping concentration.

Figure 1:
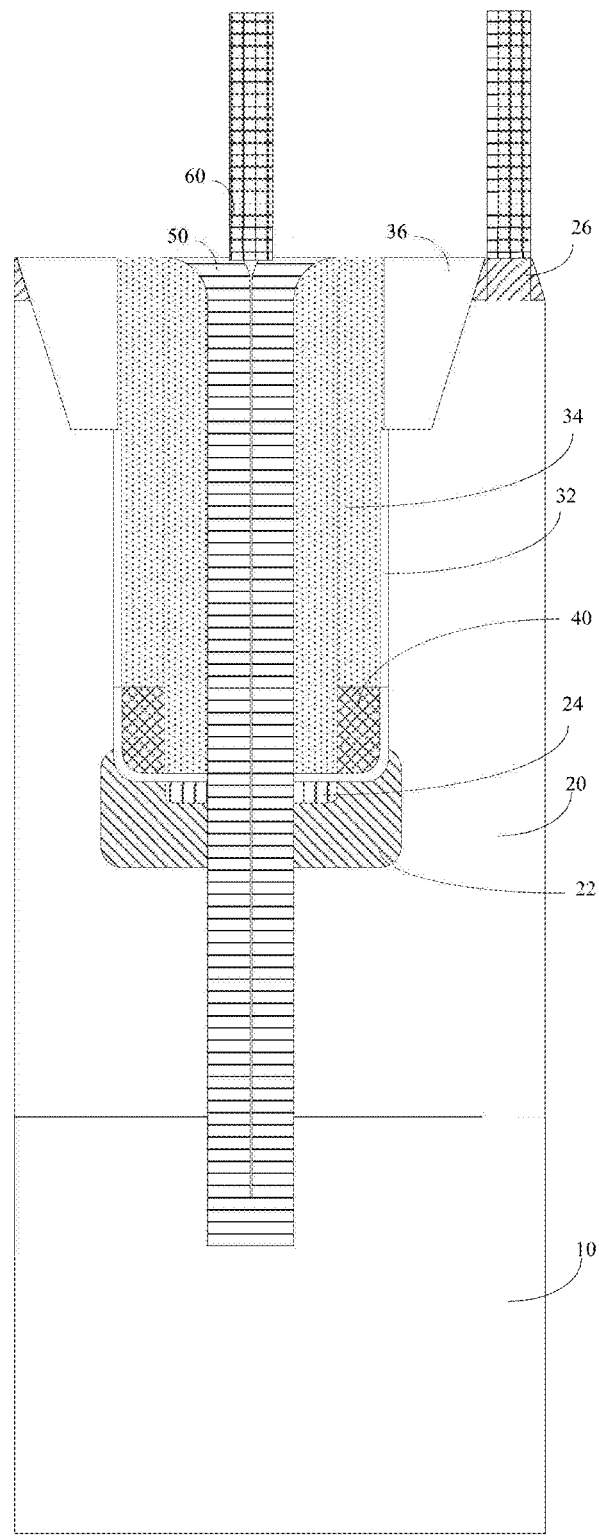
FIG. 1 is a schematic cross-sectional view of a MOSFET structure according to an embodiment.

FIG. 1 is a schematic cross-sectional view of a metal oxide semiconductor field effect transistor (MOSFET) structure according to an embodiment, which includes a substrate 10, a well region of a first conductivity type 20, a well region of a second conductivity type 22, a source 24, a drain 26, a polysilicon gate 40, a gate oxide layer 32, an insulating oxide layer 34, and a conductive plug 50. In this embodiment, the substrate 10 is a silicon substrate.

The well region of the first conductivity type 20 is disposed on the substrate 10. At least one first trench (not labeled in FIG. 1) extending downwards to the well region of the second conductivity type 22 is formed on a surface of the well region of the first conductivity type 20. The gate oxide layer 32 is disposed on an inner surface of the first trench. The area of the bottom of the first trench adjacent to the sidewall is filled with the polysilicon gate 40, which is shown in the cross-sectional view (FIG. 1) as being disposed on both sides of the bottom of the first trench, and located on the gate oxide layer 32. The source 24 has the first conductivity type, and is disposed in the well region of the second conductivity type 22 and also under an area of the first trench inside the polysilicon gate 40. The conductive plug 50 extends downwards from above the first trench and is in contact with the well region of the second conductivity type 22 after extending through the source 24. The insulating oxide layer 34 is filled into the first trench between the conductive plug 50 and the polysilicon gate 40 so as to fill the remaining space in the first trench. The insulating oxide layer 34 covers the polysilicon gate 40, thereby insulating and isolating the polysilicon gate 40 from the source 24. The insulating oxide layer 34 can be composed collectively or partly by oxide layers applied during the manufacture, such as a first insulating oxide layer and a second insulating oxide layer which will be described below.

The drain 26 has the first conductivity type, and is disposed outside the first trench and obliquely above the source 24. The drain 26 is disposed in the well region of the first conductivity type 20 in the present embodiment. In the present embodiment, the first conductivity type is N-type and the second conductivity type is P-type. Accordingly, the well region of the second conductivity type 22 is a P-type well and the well region of the first conductivity type 20 is a high-voltage N-type well. In other embodiments, the first conductivity type may be P-type, and the second conductivity type may be N-type.

According to the above-described MOSFET structure, a lateral high-voltage device (such as a laterally diffused metal oxide semiconductor field effect transistor (LDMOSFET)) made by a conventional integration process is replaced by a partial vertical device, in which the gate is buried in the device by a deep trench process to form a vertical channel region, thereby minimizing the lateral pitch required by the high-voltage device. The larger the size of the drift region, the greater the size saved. Moreover, the drain terminal of the structure is at an upper position, and compared to a vertical structure device (such as a vertical diffused metal oxide semiconductor field effect transistor (VDMOSFET)) with a drain terminal located at a lower position, the gate, the source, and the drain of the present device can all be led out from a front side, which is more convenient and compatible with the isolation processes (such as shallow trench isolation (STI)) of conventional lateral devices.

In an embodiment, a material of the insulating oxide layer 34 includes silicon oxide.

In an embodiment, a material of the conductive plug 50 includes metal. In another embodiment, the material of the conductive plug 50 includes alloy. In yet another embodiment, the material of the conductive plug 50 includes metal and metal nitride. The provision of the conductive plug 50 has an equivalent performance of a finger-shaped metal thermal sheet being inserted into the device, so that a heat dissipation path extends vertically into the device, the heat energy can be effectively led out, and the heat energy dissipation is greatly improved, thereby improving the thermal breakdown resistance of the device.

In the embodiment shown in FIG. 1, an isolation structure 36 is further disposed between the drain 26 and the first trench, and is used as a hard mask during the etching of the first trench. Specifically, after photolithography, the isolation structure is etched to the bottom thereof with an etchant suitable for etching the isolation structure (silicon oxide). An etching window resulted by the photolithography is smaller than the isolation structure 36, so that there is a portion of the isolation structure 36 reserved around the first trench resulted by etching. A required depth of the first trench is then achieved by etching with an etchant suitable for etching silicon by taking the reserved isolation structure 36 as a hard mask. It can be understood that a large number of isolation structures are formed in the wafer, and the isolation structure 36 as the hard mask during the etching of the first trench is only a part of them.

In an embodiment, the isolation structure 36 is a shallow trench isolation structure (STI). In another embodiment, the isolation structure 36 is field oxide formed by local oxidation of silicon (LOCOS).

In the embodiment shown in FIG. 1, a tungsten plug 60 is further provided, by which the conductive plug 50 and the drain 26 are led out to a metal interconnection layer for electrical connection. In other embodiments, the tungsten plug 60 may also be replaced by those of other conductive metal materials known in the art.

Devices of different potentials can be obtained by controlling the depth of the conductive plug 50 and the depth of the well region of the first conductivity type 20. For example, according to required combinations of high-voltage transistors, a low side high-voltage transistor, an isolating (Iso) high-voltage transistor, a high side high-voltage transistor, and a low side high-voltage transistor integrated with a Schottky diode, etc. are formed by adjusting the depths of the conductive plug 50 and the well region of the first conductivity type 20. The above-described MOSFET structure is also applicable to structures such as VDMOSFET and insulated gate bipolar transistor (IGBT).

Figure 2:
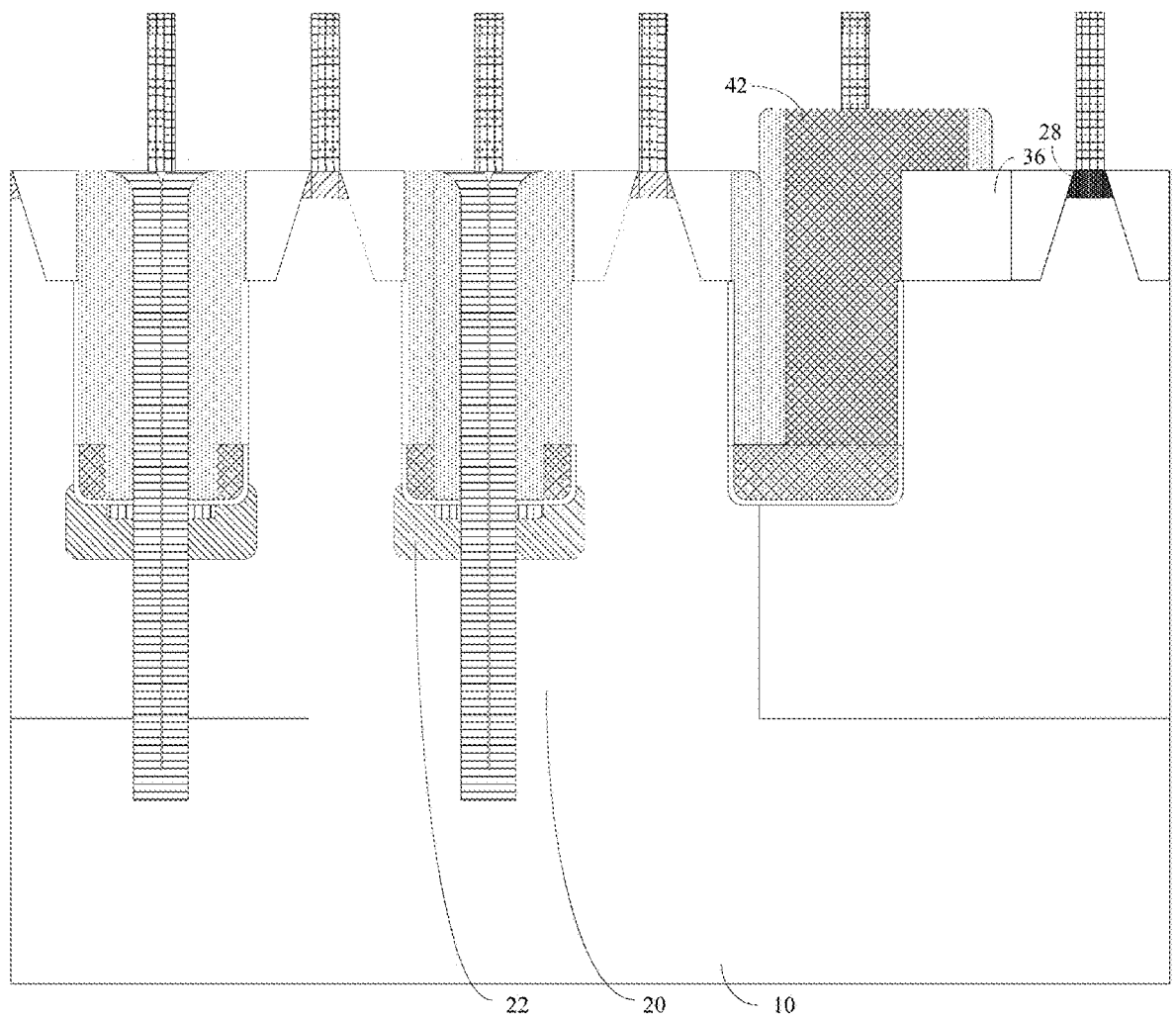
FIG. 2 is a schematic cross-sectional view of a MOSFET structure integrated with a Schottky diode according to an embodiment.

FIG. 2 is a schematic cross-sectional view of a MOSFET structure integrated with a Schottky diode according to an embodiment. In addition to the structures shown in FIG. 1, a second trench (not labeled in FIG. 2), a gate lead-out structure 42, and a substrate lead-out structure 28 are further included. The gate lead-out structure 42 extends upwards from the bottom of the second trench and is exposed from the second trench. The substrate lead-out structure 28 has the second conductivity type, and an isolation structure 36 is disposed between the substrate lead-out structure 28 and the second trench. In the embodiment where the conductive plug 50 extends downwards to the substrate 10, a substrate lead-out structure, i.e., the substrate lead-out structure 28, may not be provided.

In an embodiment, the substrate 10 has the second conductivity type. The well region of the second conductivity type 22 is disposed in the well region of the first conductivity type 20, and the conductive plug 50 extends downwards through the well region of the second conductivity type 22 and extends to the substrate 10, as seen in FIG. 1 and FIG. 2.

In the embodiment shown in FIG. 2, the material of the conductive plug 50 includes metal and metal nitride, thereby forming a longitudinal metal-semiconductor interface (i.e., forming a vertical metal-semiconductor interface with the metal serving as a contact metal of the metal-semiconductor interface). The conductive plug 50 serves as the anode of the Schottky diode, and the portion of the well region of the first conductivity type 20 between the well region of the second conductivity type 22 and the substrate 10 serves as the cathode of the Schottky diode.

Figure 3:
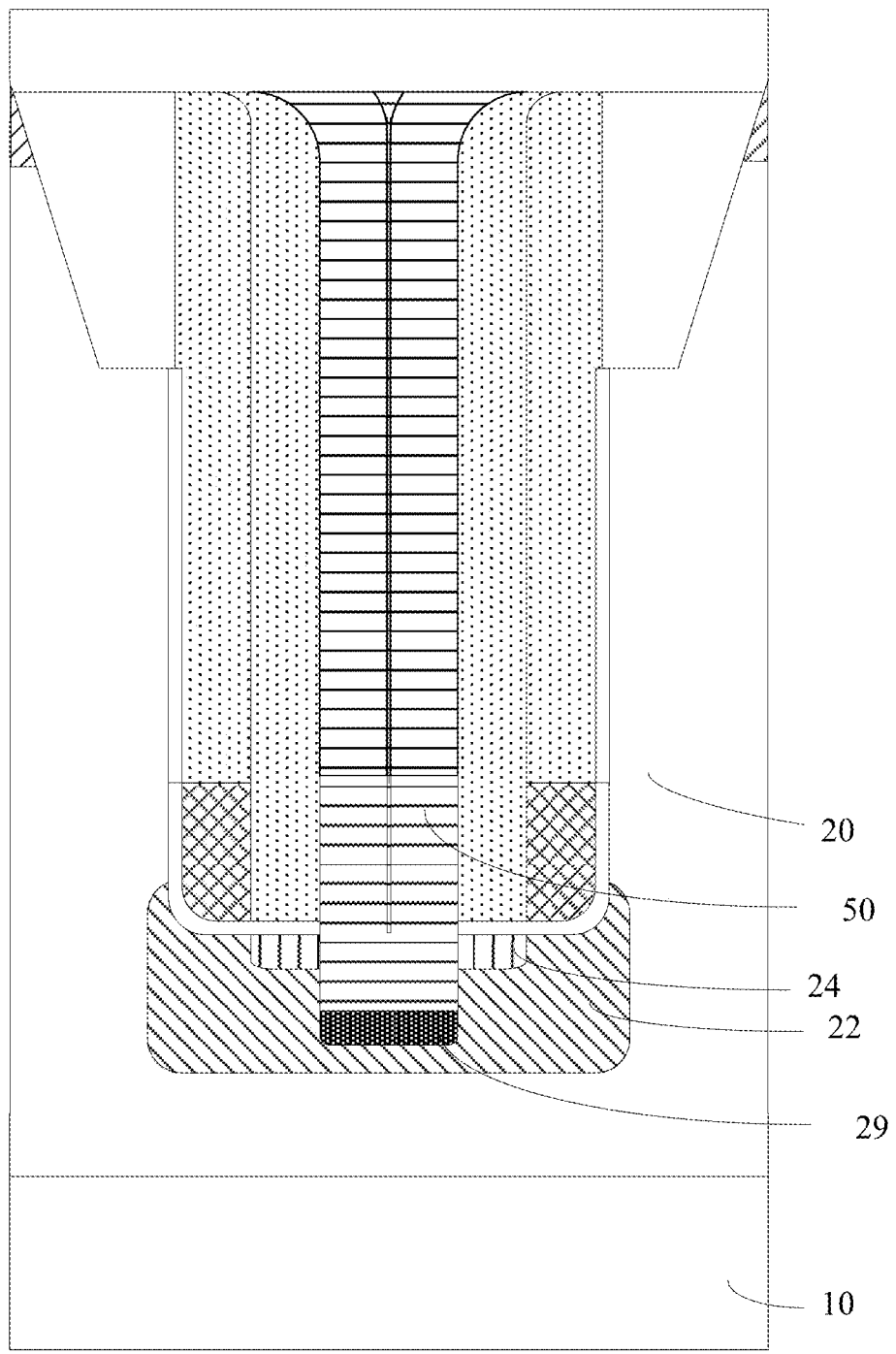
FIG. 3 is a schematic cross-sectional view of a high side high-voltage transistor using a MOSFET structure according to an embodiment.

FIG. 3 is a schematic cross-sectional view of a high side high-voltage transistor using a MOSFET structure according to an embodiment. It can be understood that the isolation high-voltage transistor can also use the structure shown in FIG. 3. Since most of the structures in FIG. 3 are the same as in FIG. 1, the reference numerals of some structures are omitted. The main difference from the structures shown in FIG. 1 is that the depth of the conductive plug 50 terminates in the well region of the second conductivity type 22, without extending downwards through the well region of the second conductivity type 22 to the substrate 10.

In the embodiment shown in FIG. 3, a doped region of the second conductivity type 29 is further provided in the well region of the second conductivity type 22 and below the source 24. The doped region of the second conductivity type 29 is in contact with the bottom of the conductive plug 50 and acts as a source lead-out structure.

Figure 4:
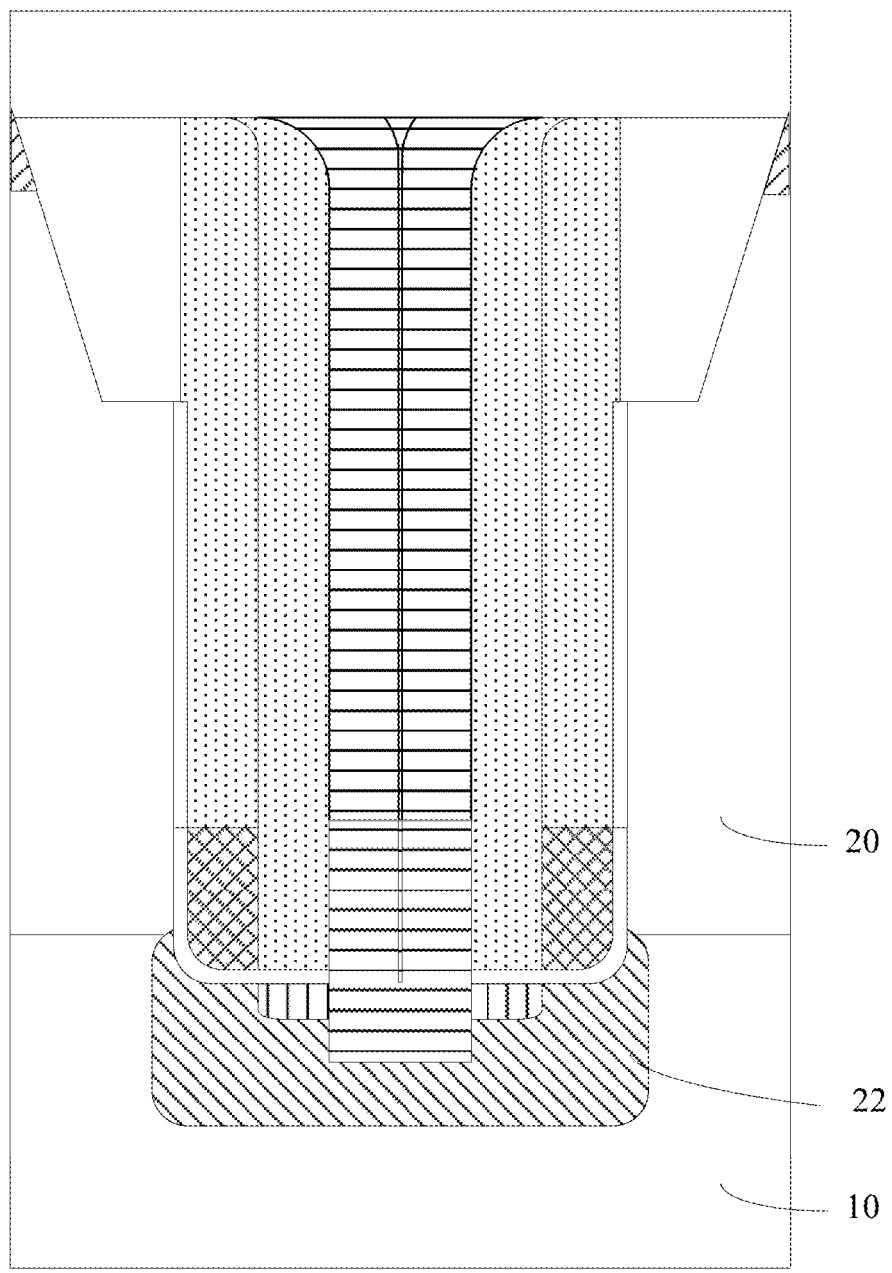
FIG. 4 is a schematic cross-sectional view of a low side high-voltage transistor using a MOSFET structure according to an embodiment.

FIG. 4 is a schematic cross-sectional view of a low side high-voltage transistor using a MOSFET structure according to an embodiment. Some of the reference numerals are also omitted. The main difference from the structures shown in FIG. 3 is that the well depth of the well region of the first conductivity type 20 is relatively smaller, and thus the well region of the second conductivity type 22 extends into the substrate 10.

Figure 5:
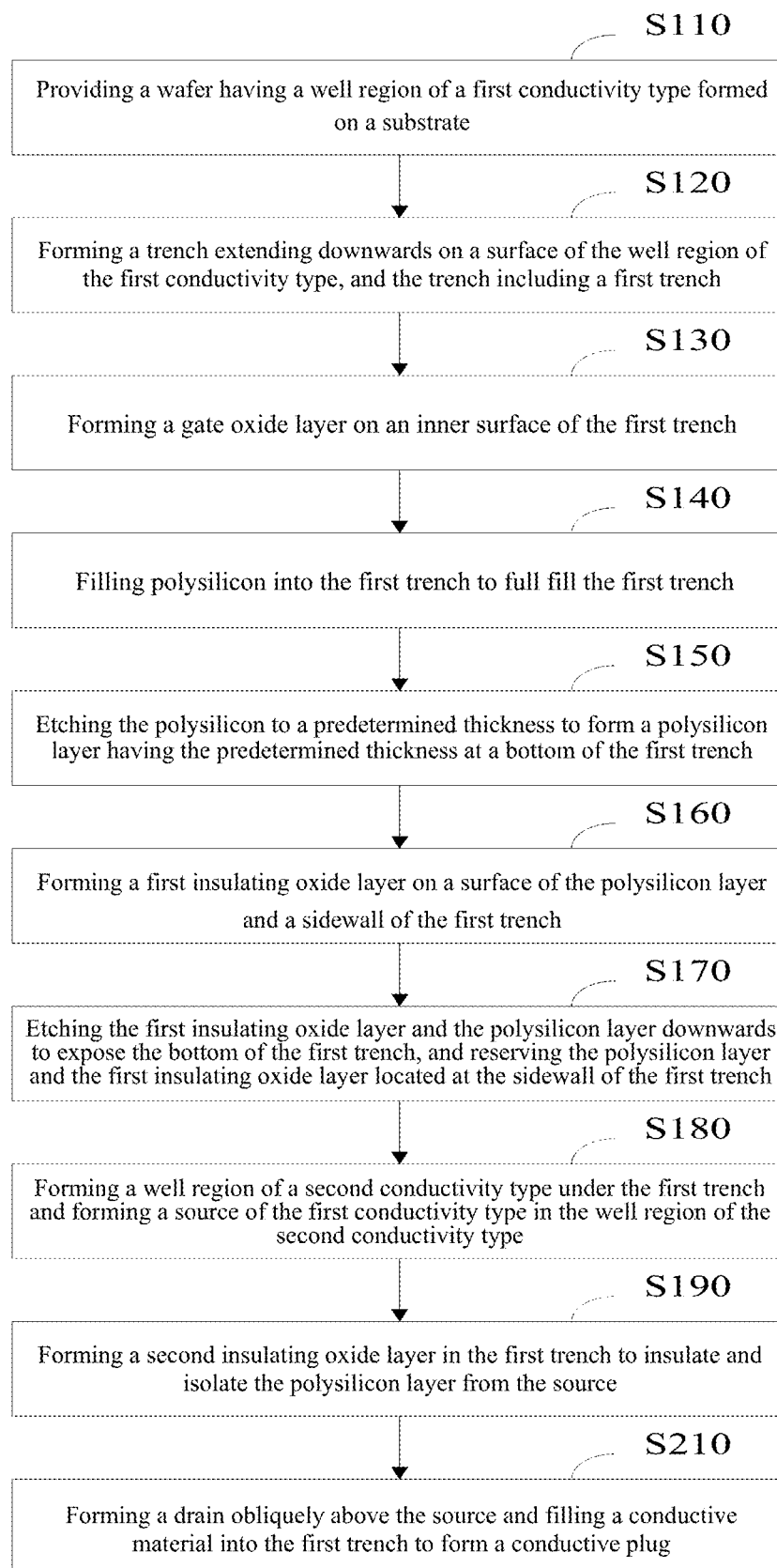
FIG. 5 is a flowchart of a method of manufacturing a MOSFET structure according to an embodiment.

FIG. 5 is a flowchart of a method of manufacturing a MOSFET structure according to an embodiment, including the following steps:

At S110, a wafer having a well region of a first conductivity type formed on a substrate is provided.

In this embodiment, the substrate is a silicon substrate. The first conductivity type is N-type, and the second conductivity type is P-type. In other embodiments, the first conductivity type may be P-type, and the second conductivity type may be N-type.

At S120, a trench extending downwards is formed on a surface of the well region of the first conductivity type, and the trench includes a first trench.

Figure 6A:
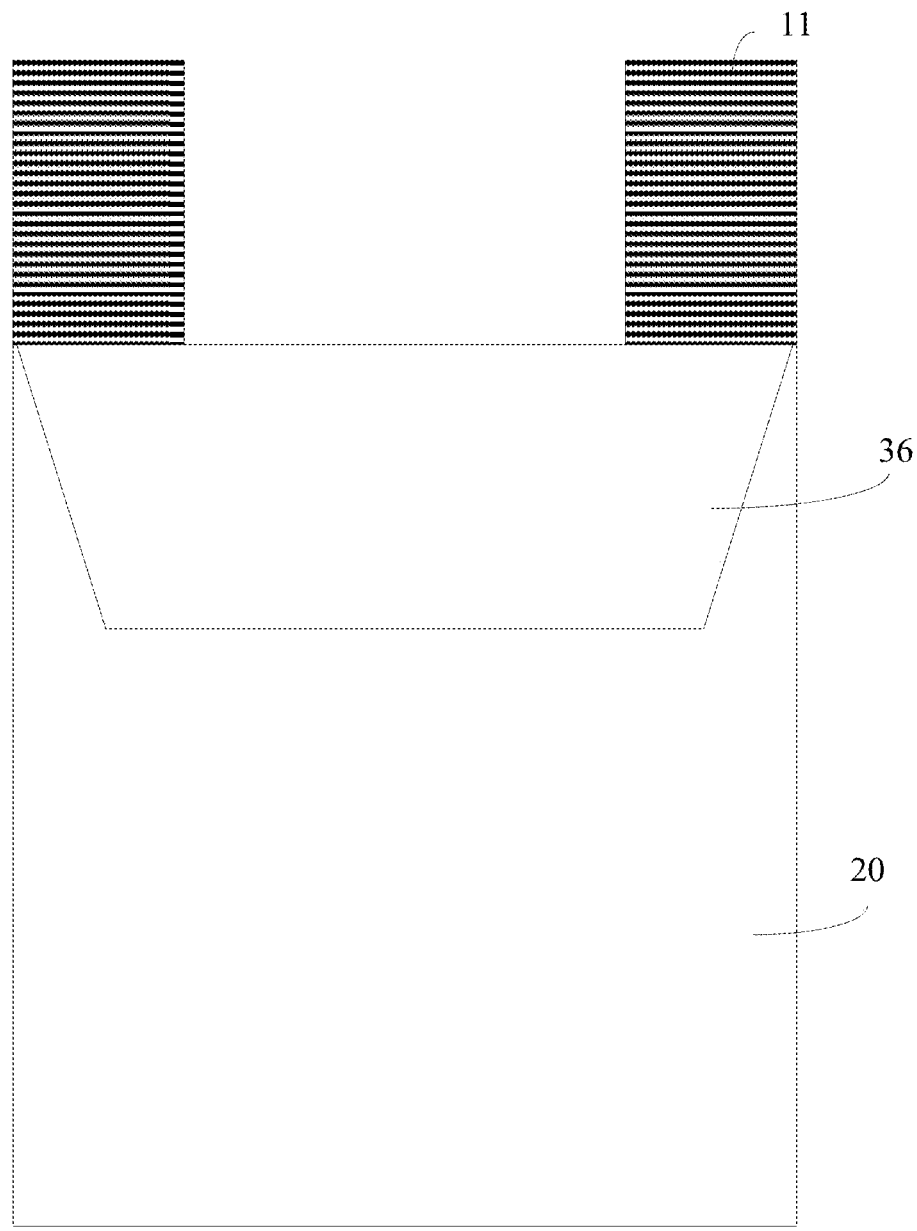
FIGS. 6a to 6f are schematic cross-sectional views of a device after completion of each intermediate step of a method of manufacturing a MOSFET structure according to an embodiment.
Figure 6B:
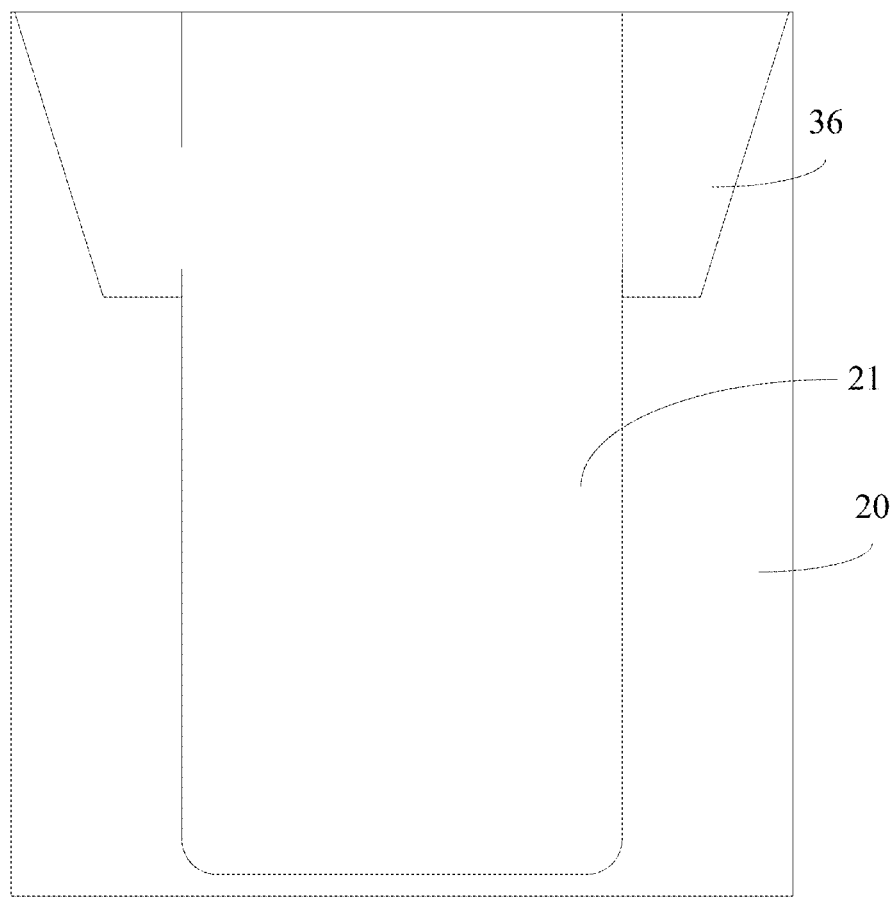

In this embodiment, the wafer provided in the step S110 is further formed with an isolation structure 36, as shown in FIG. 6a. In an embodiment, the isolation structure 36 is a shallow trench isolation (STI) structure. In another embodiment, the isolation structure 36 is a field oxide formed by LOCOS. In this embodiment, the step S120 includes forming a photoresist pattern 11 by photolithography to expose a corresponding portion of the isolation structure 36 and block the remaining portion of the same, according to the size requirements of the first trench, and etching the isolation structure 36 with an etchant suitable for etching silicon oxide by taking the photoresist pattern 11 as a mask. Referring to FIG. 6b, after the isolation structure 36 is etched through, the well region of the first conductivity type 20 is etched downwards to form the first trench by taking the reserved isolation structure 36 protected by the photoresist pattern 11 without being etched as a hard mask. In an embodiment, the photoresist could be stripped before the downward etching using the isolation structure 36 as a hard mask.

At S130, a gate oxide layer is formed on an inner surface of the first trench.

Figure 6C:
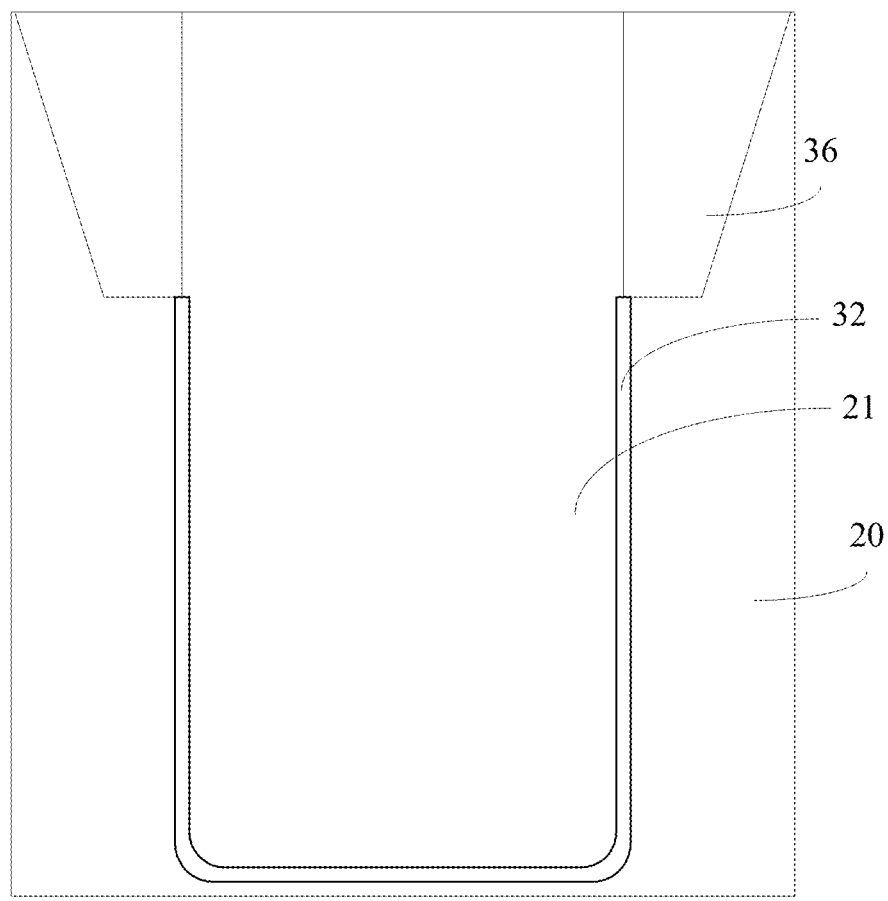

The gate oxide layer 32 can be formed through a thermal oxidation process. For the inner surface of the first trench 21, the gate oxide layer 32 will be only formed on the surface of the silicon (the well region of the first conductivity type 20), but not on the surface of the isolation structure 36, as shown in FIG. 6c.

At S140, the polysilicon is filled into the first trench to full fill the first trench.

In an embodiment, the polysilicon can be filled by a deposition process, and a deposited polysilicon layer may overflow out of the trench.

At S150, the polysilicon is etched to a predetermined thickness to form a polysilicon layer having the predetermined thickness at a bottom of the first trench.

Figure 6D:
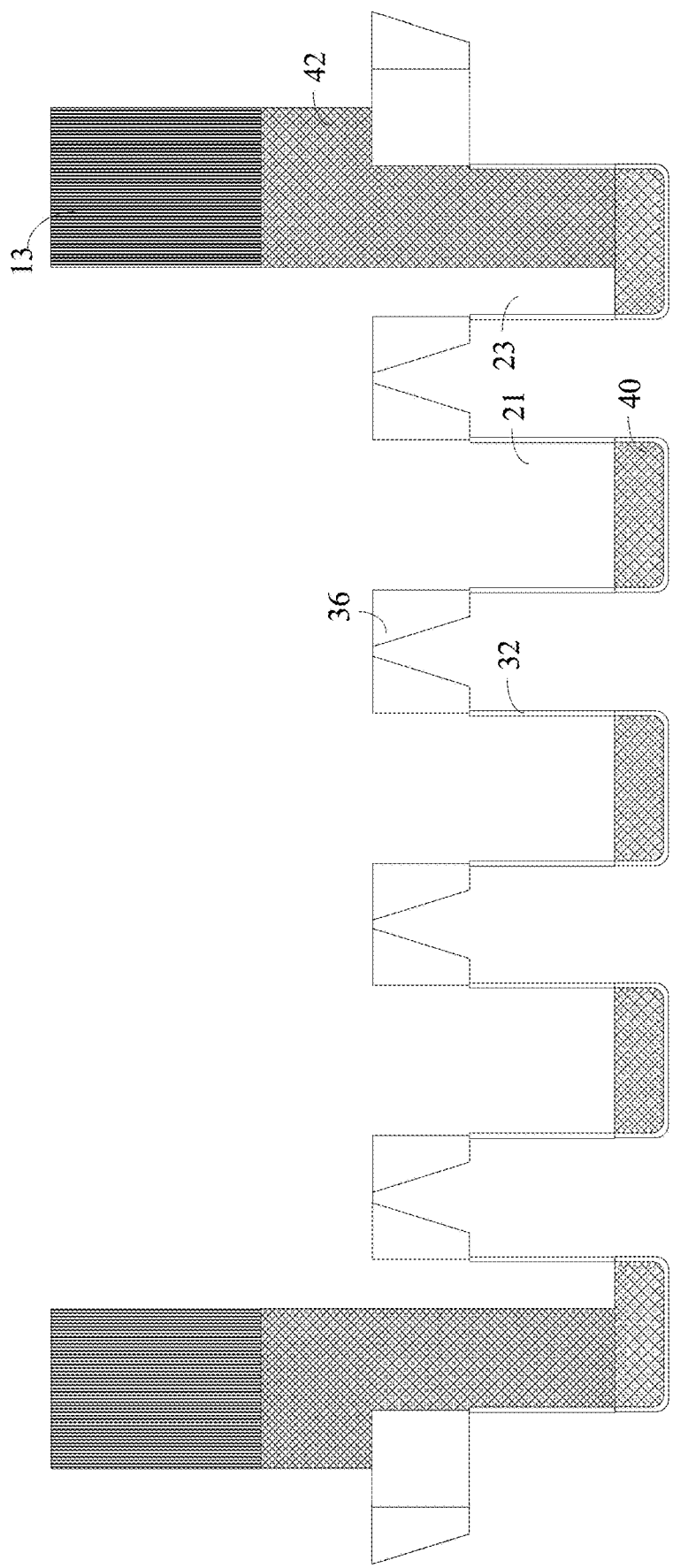

In an embodiment, the trenches etched in the step S120 include a first trench 21 and a second trench 23. The second trench 23 has a ring shape and thus can be seen on both sides of the cross-sectional view in FIG. 6d. A plurality of first trenches 21 are formed between the two second trenches 23. Similarly, in the step S130, a gate oxide layer 32 is also formed on an inner surface of the second trench 23, and in the step S140, the second trench 23 is also filled with polysilicon, as shown in FIG. 6d. In the step S150, photolithography is performed to form a photoresist pattern 13 prior to etching, and the polysilicon in the second trench 23 is at least partially blocked by the photoresist pattern 13, so that the gate lead-out structure 42 exposed from the second trench 23 is formed after the etching. The photoresist pattern 13 is stripped after etching. Similarly, a polysilicon gate 40 is also formed at the bottom of the first trench 21.

In an embodiment, the etching of the first trench 21 and the second trench 23 can be performed simultaneously, so that only one step of photolithography (the photolithography required for etching the isolation structure 36) is required. In other embodiments, the first trench 21 and the second trench 23 may also be etched separately. That is to say, the first trench 21 and the second trench 23 may be etched with different photolithography masks, so that the first trench 21 and the second trench 23 may be etched to different depths.

At S160, a first insulating oxide layer is formed on a surface of the polysilicon layer and a sidewall of the first trench.

Figure 6E:
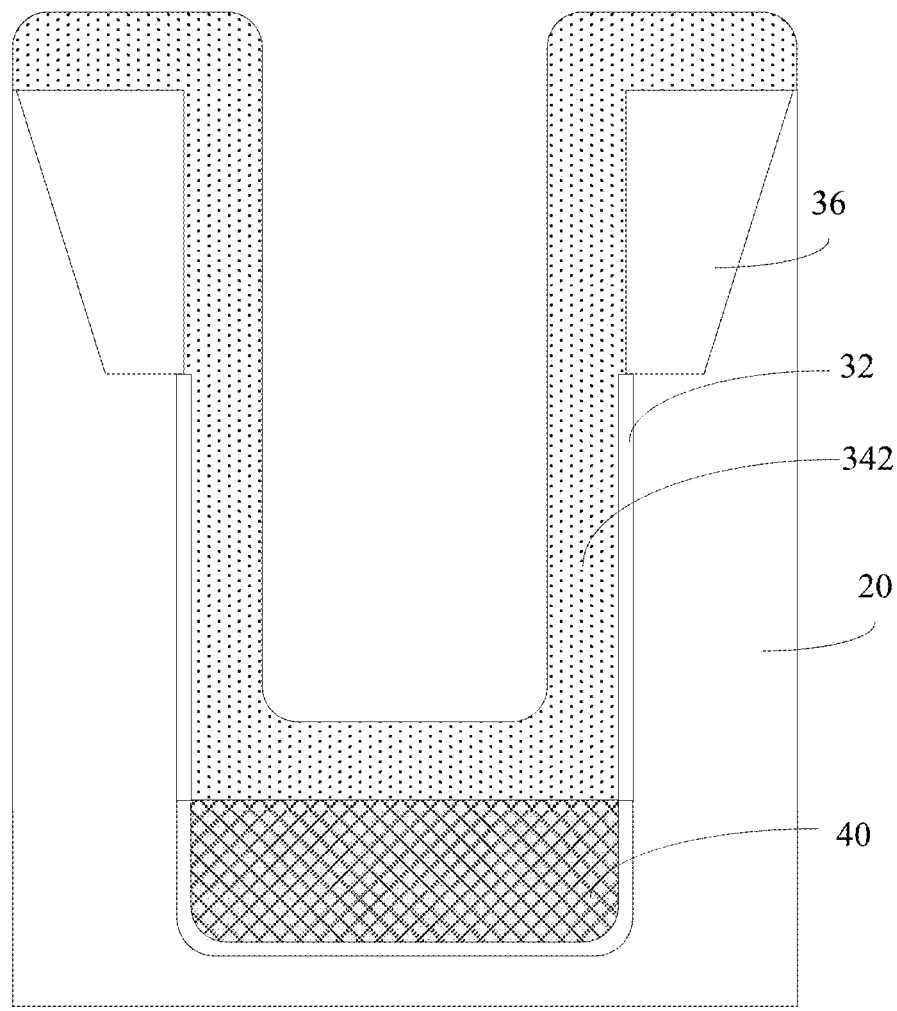

In an embodiment, a first insulating oxide layer 342 may be formed by a deposition process, as shown in FIG. 6e. In this embodiment, the first insulating oxide layer 342 is made of silicon oxide. It can be understood that, for the embodiments requiring the formation of the second trench 23, the first insulating oxide layer is also formed on the surface of the polysilicon layer of the second trench 23.

At S170, the first insulating oxide layer and the polysilicon layer are etched downwards to expose the bottom of the first trench, and the polysilicon layer and the first insulating oxide layer located at the sidewall of first trench are reserved.

In an embodiment, the first insulating oxide layer 342 is etched back first. The first insulating oxide layer 342 located at the sidewall of the first trench is reserved after the etching back, while the first insulating oxide layer 342 located in the middle of the first trench is etched away to expose the polysilicon gate 40. An etchant suitable for etching the silicon oxide is used for the etching without any usage of photoresist. The polysilicon gate 40 is then etched with an etchant suitable for etching the polysilicon by taking the first insulating oxide layer 342 as a mask to expose the bottom of the first trench.

At S180, a well region of a second conductivity type is formed under the first trench and a source of the first conductivity type is formed in the well region of the second conductivity type.

Figure 6F:
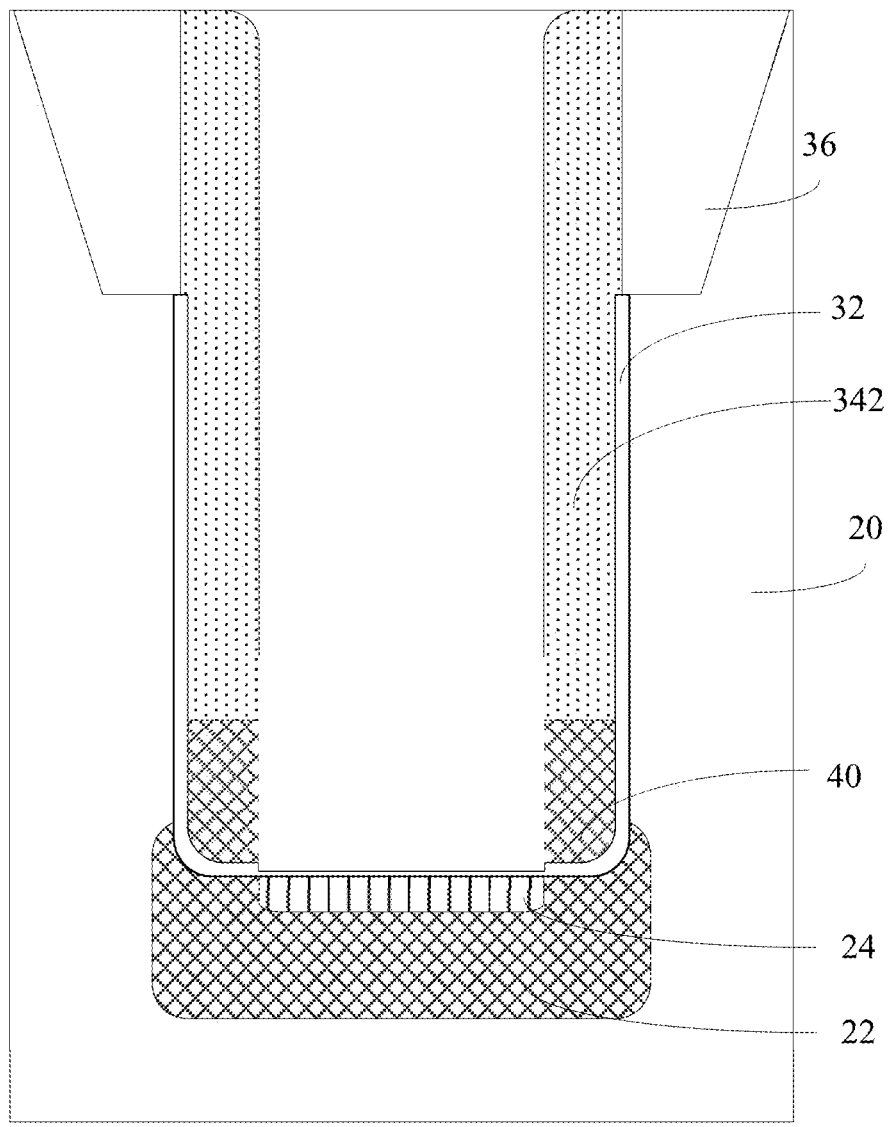

In this embodiment, ions of the second conductivity type are implanted into the first trench to form the well region of the second conductivity type 22 under the first trench. Ions of the first conductivity type are then implanted to form the source 24 in the well region of the second conductivity type 22. The first insulating oxide layer 342 on the sidewall of the first trench serves as a blocking layer when the ions of the first and second conductivity types are implanted. A drive-in process is required after the ions of the second conductivity type are implanted. In order to ensure better insulation between the polysilicon gate 40 and the source 24, in an embodiment, the drive-in is performed before the formation of the source 24 by ions implantation, such that the source 24 does not substantially overlap with the polysilicon gate 40 along a lateral direction due to the blocking effect of the first insulating oxide layer 342, as seen in FIG. 6*f*.

At S190, a second insulating oxide layer is formed in the first trench to insulate and isolate the polysilicon layer from the source.

The second insulating oxide layer may be filled into the first trench by a deposition process. In an embodiment, the first trench may be full filled with the second insulating oxide layer, while in another embodiment, the first trench may be filled with the second insulating oxide layer but not full. In an embodiment, the second insulating oxide layer at the bottom of the first trench may be etched away after deposition for additional processes. The additional processes, for example, include formation of a doped region of the second conductivity type 29 that acts as a source lead-out structure. Specifically, after the second insulating oxide layer at the bottom of the first trench is etched away, implantation of the ions of the second conductivity type may be performed, by which a doped region of the second conductivity is formed in the well region of the second conductivity type 22 and below the source 24, and is to be under and in contact with a conductive plug to be formed in a subsequent process. The doped region of the second conductivity 29 has a higher concentration than the source formed by the implantation in the step S180 (a lightly doped source process can be used for the implantation in the step S180), so the doped region formed by the present implantation actually acts as the source lead-out structure. After the additional processes, the first trench can be then full filled with insulating oxide material.

At S210, a drain is formed obliquely above the source, and a conductive material is filled into the first trench to form a conductive plug.

Ions of the first conductivity type are implanted obliquely above the source 24 and outside the first trench to form the drain 26. The second insulating oxide layer at the bottom of the first trench is etched to expose the well region of the second conductivity type and the source 24, and the first trench is filled with a conductive material to form the conductive plug 50 that extends through the source 24 and is in contact with the well region of the second conductivity type 22. The structure of the device after the step S210 can be seen in FIG. 4.

The etched second insulating oxide layer and the foregoing first insulating oxide layer can collectively form the insulating oxide layer 34 as mentioned in the description of the structure of the device.

Figure 7:
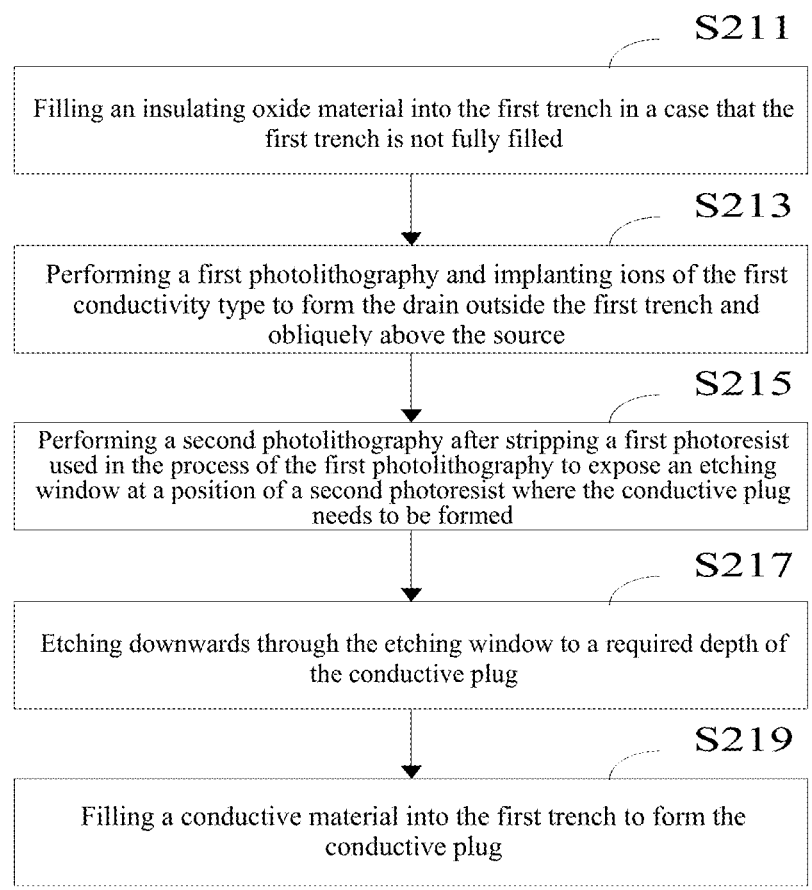
FIG. 7 is a flowchart of sub-steps of the step S210 of the method shown in FIG. 5 according to an embodiment.

FIG. 7 is a flowchart of sub-steps of the step S210 according to an embodiment, which specifically includes:

At S211, an insulating oxide material is filled into the first trench in a case that the first trench is not fully filled.

Since photolithography is required in the next steps, the first trench is filled with the insulating oxide material to prevent a photoresist from being filled into the first trench which is otherwise difficult to be thoroughly removed.

At S213, a first photolithography is performed and ions of the first conductivity type are implanted to form a drain outside the first trench and obliquely above the source.

A first photoresist is applied and the first photolithography is performed to expose the area where the drain is to be formed, and then the ions of the first conductivity type are implanted to form the drain.

At S215, a second photolithography is performed after stripping the first photoresist used in the process of the first photolithography to expose an etching window at a position of a second photoresist where the conductive plug needs to be formed.

In an embodiment, a third insulating oxide layer is formed on the surface of the wafer to cover the drain after stripping the first photoresist. The second photoresist is applied and the second photolithography is performed to expose an etching window at a position where the conductive plug needs to be formed. In an embodiment, the material of the third insulating oxide layer includes silicon oxide.

At S217, etching is performed downwards through the etching window to a required depth of the conductive plug.

In an embodiment, an etchant suitable for etching silicon oxide is used to etch downwards to the bottom of the first trench through the etching window. The second photoresist is then stripped, and an etchant suitable for etching silicon is used to continue etching to the required depth of the conductive plug by taking the third insulating oxide layer as an etching mask. The drain is protected by the third insulating oxide layer and thus cannot be etched.

At S219, a conductive material is filled into the first trench to form the conductive plug.

In an embodiment, after the step S219, the method further includes a step of forming an interlayer dielectric (ILD) layer, a step of performing photolithography and etching the interlayer dielectric layer to form a contact hole, and a step of filling the contact hole with metal tungsten to form a tungsten plug to lead out the conductive plug and the drain. Metal interconnection layers are subsequently used to provide electrical connection for the conductive plug and the drain.

The above-mentioned embodiments represent a couple of implementation manners of the present disclosure only, with the descriptions thereof are relatively specific and detailed. However, they cannot be understood as limiting the scope of the disclosure. It should be noted that, for those of ordinary skill in the art, without departing from the concept of the present disclosure, modifications and improvements can be made, which all belong to the protection scope of the present disclosure. Therefore, the protection scope of the invention shall be subject to the appended claims.

What is claimed is:

1. A metal oxide semiconductor field effect transistor (MOSFET) structure, comprising: a substrate; a well region of a first conductivity type disposed on the substrate; at least one first trench formed on a surface of the well region of the first conductivity type and extending downwards; a well region of a second conductivity type, the first trench extending downwards to the well region of the second conductivity type; a gate oxide layer disposed on an inner surface of the first trench; a polysilicon gate disposed inside the gate oxide layer and filled in a portion of a bottom and a sidewall of the first trench; a source having the first conductivity type, the source being disposed in the well region of the second conductivity type and under the first trench and within the polysilicon gate; a conductive plug extending downwards from above the first trench, and being in contact with the well region of the second conductivity type after extending through the source; an insulating oxide layer filled in the first trench between the conductive plug and the polysilicon gate, the insulating oxide layer covering the polysilicon gate and insulating and isolating the polysilicon gate from the source; and a drain having the first conductivity type, the drain being disposed in the well region of the first conductivity type, outside the first trench and obliquely above the source; wherein the first conductivity type and the second conductivity type are opposite conductivity types.

2. The MOSFET structure according to claim 1, further comprising an isolation structure disposed between the drain and the first trench.

3. The MOSFET structure according to claim 1, further comprising:
a second trench;
a gate lead-out structure extending upwards from a bottom of the second trench and exposed from the second trench;
a substrate lead-out structure having the second conductivity type, an isolation structure being provided between the substrate lead-out structure and the second trench.

4. The MOSFET structure according to claim 1, wherein the substrate has the second conductivity type, the well region of the second conductivity type is disposed in the well region of the first conductivity type, the conductive plug extends downwards through the well region of the second conductivity type to the substrate.

5. The MOSFET structure according to claim 1, wherein a material of the conductive plug comprises metal.

6. The MOSFET structure according to claim 1, wherein a material of the conductive plug comprises alloy.

7. The MOSFET structure according to claim 1, wherein a material of the conductive plug comprises metal and metal nitride.

8. The MOSFET structure according to claim 1, wherein a material of the insulating oxide layer comprises silicon oxide.

9. The MOSFET structure according to claim 1, further comprising a tungsten plug, the conductive plug and the drain being led out to a metal interconnection layer through the tungsten plug for electrical connection.

10. The MOSFET structure according to claim 1, wherein the well region of the second conductivity type extends into the substrate, and the conductive plug extends through the source and is in contact with the well region of the second conductivity type.

11. The MOSFET structure according to claim 1, further comprising a doped region of the second conductivity type disposed in the well region of the second conductivity type and below the source.

12. The MOSFET structure according to claim 2, wherein the isolation structure is a shallow trench isolation structure.

13. The MOSFET structure according to claim 1, wherein the first conductivity type is N-type, and the second conductivity type is P-type.

14. A method of manufacturing a MOSFET structure, comprising:
step S110, providing a wafer having a well region of a first conductivity type formed on a substrate;
step S120, forming a trench extending downwards on a surface of the well region of the first conductivity type, and the trench comprising a first trench;
step S130, forming a gate oxide layer on an inner surface of the first trench;
step S140: filling polysilicon into the first trench to full fill the first trench;
step S150, etching the polysilicon to a predetermined thickness to form a polysilicon layer having the predetermined thickness at a bottom of the first trench;
step S160, forming a first insulating oxide layer on a surface of the polysilicon layer and a sidewall of the first trench;
step S170, etching the first insulating oxide layer and the polysilicon layer downwards to expose the bottom of the first trench, and reserving the polysilicon layer and the first insulating oxide layer located at the sidewall of the first trench;
step S180, forming a well region of a second conductivity type under the first trench and forming a source of the first conductivity type in the well region of the second conductivity type;
step S190, forming a second insulating oxide layer in the first trench to insulate and isolate the polysilicon layer from the source; and
step S210, forming a drain obliquely above the source and filling a conductive material into the first trench to form a conductive plug;
wherein the first conductivity type and the second conductivity type are opposite conductivity types.

15. The manufacturing method according to claim 14, wherein the wafer provided in the step S110 is further formed with an isolation structure; and wherein the step S120 comprises etching a portion of the isolation structure after photolithography, and then further etching the well region of the first conductivity type downwards to form the first trench by taking the isolation structure protected by a photoresist without being etched as a hard mask after the isolation structure is etched through.

16. The manufacturing method according to claim 14, wherein the step S120 further comprises forming a second trench simultaneously;
wherein the step S130 further comprises forming a gate oxide layer on an inner surface of the second trench simultaneously;
wherein the step S140 further comprises full filling the second trench with polysilicon; and
wherein the step S150 comprises etching after photolithography, a photoresist formed by the photolithography at least partially block the polysilicon in the second trench, thereby forming a gate lead-out structure exposed from the second trench after etching.

17. The manufacturing method according to claim 14, wherein the step S180 further comprises a step of forming a doped region of the second conductivity type in the well region of the second conductivity type and below the source by implanting ions of the second conductivity type, the doped region of the second conductivity type being in contact with the bottom of the conductive plug and acting as a source lead-out structure.

18. The manufacturing method according to claim 14, wherein the step S210 comprises:
   step S211, filling an insulating oxide material into the first trench in a case that the first trench is not fully filled;
   step S213, performing a first photolithography and implanting the ions of the first conductivity type to form the drain outside the first trench and obliquely above the source;
   step S215, performing a second photolithography after stripping a first photoresist used in the process of the first photolithography to expose an etching window at a position of a second photoresist where the conductive plug needs to be formed;
   step S217, etching downwards through the etching window to a required depth of the conductive plug; and
   step S219, filling the conductive material into the first trench to form the conductive plug.

19. The manufacturing method according to claim 18, wherein the step S215 comprises forming a third insulating oxide layer on a surface of the drain after stripping the first photoresist, and then performing the second photolithography; and
   wherein the step S217 comprises etching downwards through the etching window to the bottom of the first trench by using a first etchant, and then stripping a second photoresist, and further etching to the required depth of the conductive plug by using a second etchant and by taking the third insulating oxide layer as an etching mask.

20. The manufacturing method according to claim 14, wherein the substrate has the second conductivity type; in the step S180, an implantation depth of the ions of the second conductivity type is controlled so that the well region of the second conductivity type is formed in the well region of the first conductivity type; in the step 210, the conductive plug extends downwards through the well region of the second conductivity type to the substrate.

* * * * *